United States Patent
Hosobata et al.

(10) Patent No.: US 7,944,166 B2
(45) Date of Patent: May 17, 2011

(54) REACTION FORCE CANCEL SYSTEM

(75) Inventors: Takuya Hosobata, Yokosuka (JP);
Kazuya Hioki, Yokosuka (JP)

(73) Assignee: Sumitomo Heavy Industries,
Shinagawa-Ku, Tokyo (JP)

( * ) Notice: Subject to any disclaimer, the term of this patent is extended or adjusted under 35 U.S.C. 154(b) by 372 days.

(21) Appl. No.: 12/219,847

(22) Filed: Jul. 29, 2008

(65) Prior Publication Data
US 2009/0284207 A1    Nov. 19, 2009

(30) Foreign Application Priority Data
Jul. 31, 2007   (JP) ............... P2007-199548

(51) Int. Cl.
*G05B 11/32* (2006.01)
(52) U.S. Cl. .......... 318/568.17; 318/611; 318/649; 318/686; 318/687
(58) Field of Classification Search .......... 318/611, 318/649, 687, 686, 568.1; 310/10, 12.01, 310/36, 13, 15
See application file for complete search history.

(56) References Cited

U.S. PATENT DOCUMENTS

| | | | | |
|---|---|---|---|---|
| 5,959,427 A | * | 9/1999 | Watson | 318/687 |
| 6,028,376 A | * | 2/2000 | Osanai et al. | 310/12.13 |
| 6,462,828 B1 | * | 10/2002 | Takeishi | 356/500 |
| 6,538,348 B2 | * | 3/2003 | Sawai et al. | 310/12.06 |
| 6,879,375 B1 | * | 4/2005 | Kayama | 355/53 |
| 7,589,823 B2 | * | 9/2009 | Shibazaki | 355/72 |
| 2008/0068568 A1 | * | 3/2008 | Ebihara et al. | 355/30 |

FOREIGN PATENT DOCUMENTS

| | | |
|---|---|---|
| JP | 8-288198 A | 11/1996 |
| JP | 10-256141 A | 9/1998 |
| JP | 11-317350 A | 11/1999 |
| JP | 2000-40650 | 2/2000 |

* cited by examiner

*Primary Examiner* — Rita Leykin
(74) *Attorney, Agent, or Firm* — Squire, Sanders & Dempsey (US) LLP

(57) ABSTRACT

Stabilization of a stage in a movable stage apparatus is enhanced, and increasing in size of the movable stage apparatus is suppressed. A reaction force cancel system is provided in the movable stage apparatus where a stage moves on a surface plate installed on a floor via a vibration-isolating spring, and cancels a reaction force generated on the surface plate upon movement of the stage. The reaction force cancel system includes a reaction force canceling actuator for applying a counter-thrust that is a force for reducing the reaction force to the surface plate. The reaction force canceling actuator is arranged at a lower position than a top surface of the surface plate so that the surface plate hangs over the reaction force canceling actuator.

8 Claims, 3 Drawing Sheets

REACTION FORCE CANCEL SYSTEM

BACKGROUND OF THE INVENTION

1. Field of the Invention

The present invention relates to a reaction force cancel system for improving stabilization of a stage in a movable stage apparatus.

2. Related Background of the Invention

Conventionally, a movable stage apparatus in which a stage moves on a surface plate installed on a base via a vibration-isolating section has been in use as an exposure apparatus for semiconductors and liquid crystals, and an inspection equipment, for example. In this movable stage apparatus, a higher acceleration and deceleration of the stage has been sought for purpose of improving throughput per unit time, for example. However, if the stage is highly accelerated or decelerated, there is a risk that there may be an increase in a reaction force generated on the surface plate upon movement of the stage, and thus the stabilization of the stage may become worse.

Thus, in recent years, a reaction force cancel system for canceling a reaction force generated on a surface plate upon movement of a stage has been developed (for example, refer to Japanese Patent Application Laid-Open No. 11-329962). In such a reaction force cancel system, a force for reducing the reaction force is applied to the surface plate, by means of an application device.

SUMMARY OF THE INVENTION

Incidentally, in the reaction force cancel system, as described above, a plurality of application devices is provided to cooperate each other in parallel in height direction in order to remove a moment acting on the surface plate by the effect of a reaction force. For this reason, a movable stage apparatus becomes large and heavy, and thus a reaction force cancel system might become bigger in size.

In addition, it is also considered that application devices are provided so that the height of action point of a reaction force and the height of action point of a force for reducing the reaction force may coincide with each other in order not to cause a moment to be generated in the surface plate. However, in this case, installed area of the movable stage apparatus will become larger for securing the space enough to arrange the reaction force cancel system, and the movable stage apparatus might become large in size.

Thus, it is an object of the present invention to provide a reaction force cancel system that can improve the stabilization of a stage in the movable stage apparatus, and can suppress an increase in size of the movable stage apparatus.

In order to achieve the above-mentioned object, as the result that the present inventors have made earnestly extensive researches, they found that, provided a force acting on the surface plate can be reliably reduced and removed, the stabilization of a stage can be achieved even if a moment acting on the surface plate is not completely removed. That is, they found that, if a force acting on the surface plate is reduced and removed, and a moment acting on the surface plate is made sufficiently small, the stabilization of the stage can be sufficiently improved. The present invention has been made based on such finding.

In other words, a reaction force cancel system according to the present invention is the one provided in a movable stage apparatus in which a stage moves on a surface plate installed on a base via a vibration-isolating section, for canceling a reaction force generated in the surface plate upon movement of the stage, the system comprising, an application device for applying a force for reducing the reaction force to the surface plate, wherein the application device is arranged in the base side than a plate surface of the surface plate such that the surface plate hangs over the application device.

In this reaction force cancel system, a force for reducing a reaction force by an application device is applied to the surface plate. Consequently, this applied force and the reaction force are cancelled each other, resulting in eliminating a force acting on the surface plate. Here, by the reason that the application device is arranged at the base side rather than the plate surface of the surface plate so that the surface plate hangs over the application device, the height of the action point of the reaction force and the height of the action point of a force for reducing the reaction force do not coincide with each other. As a result, a moment acting on the surface plate can not be completely eliminated, although in the case where the moment acting on the surface plate is sufficiently small (for example, difference between the height of the action point of the reaction force and the height of the action point of the force for reducing the reaction force is equal to or shorter than a predetermined distance), improved stabilization of the stage can be sufficiently achieved.

Further, as described above, by the reason that the application device is arranged at the base side rather than the plate surface of the surface plate so that the surface plate hangs over the application device, the space for the plate surface of the surface plate can be sufficiently secured, and there is no need to increase the installed area (so-called footprint) of the movable stage apparatus. That is, the space for the movable stage apparatus can be efficiently utilized, and it becomes possible to further suppress an increase in size of the movable stage apparatus. Therefore, according to the present invention, stabilization of the stage of the movable stage apparatus can be improved, and the increase in size of the movable stage apparatus can be suppressed.

Further, a difference h between the height of action point of a reaction force acting on the surface plate and the height of action point of a force for reducing the reaction force acting on the surface plate is preferably equal to or less than a tolerance $h_{max}$ as expressed in the following equation:

$$h_{max} = (Y_{max} \cdot J \cdot K_p)/(N \cdot M_{SLIDER} \cdot f_r)$$

where,
- $Y_{max}$: tolerance of positional deviation of stage
- $J$: moment of inertia of movable stage apparatus
- $K_p$: control gain
- $N$: distance from the height of center of gravity of movable stage apparatus to the height of measuring point of position of stage
- $M_{SLIDER}$: mass of stage
- $f_r$: reaction force.

Whereby, in the case where a positional deviation permitted to the stage is predetermined as the specification, a tolerance $h_{max}$ can be set based on the specification, and by making a difference h to be equal to or less than the tolerance $h_{max}$, the above-mentioned effect, that is, the effect of improving the stabilization of the stage in the movable stage apparatus, and suppressing an increase in size of the movable stage apparatus can be reliably achieved. It is noted that, positional deviation of a stage means the amount of deviation of a stage position, and control gain means a control value for bringing the stage close to a target position.

Further, it is preferable for an application device to be designed to be adjustable in height. In this case, even if an accuracy of a stage (for example, positional deviation) required for the movable stage apparatus has been changed, it becomes possible to cope with such the accuracy by adjusting the height of the application device.

Further, the application device has a movable element attached to the surface plate, and a stator attached to a base contactlessly with the movable element, and it is preferably configured such that a force for reducing the reaction force is applied from the stator to the movable element. In this case, by the reason that the movable element and the stator are contactless with each other, vibration from the base can be suppressed from propagating to the surface plate via an application means.

Further, a reaction force cancel system according to the present invention is the one provided in a movable stage apparatus where a stage moves on the surface plate supported by a vibration-isolating section, for canceling a reaction force generated on the surface plate upon movement of the stage, the reaction force cancel system comprising: an actuator for applying a force to the surface plate, wherein the actuator is characterized in that it is provided in a recessed section of the surface plate side face.

Here, the actuator has a movable element and a stator, and it is preferable that the movable element is fixedly secured in the interior of a recessed section. In addition, the stator is arranged contactlessly with the movable element in the interior of the recessed section. In addition, it is preferable that the stator does not protrude beyond a side face of the surface plate.

DESCRIPTION OF THE PREFERRED EMBODIMENTS

Figure 1:
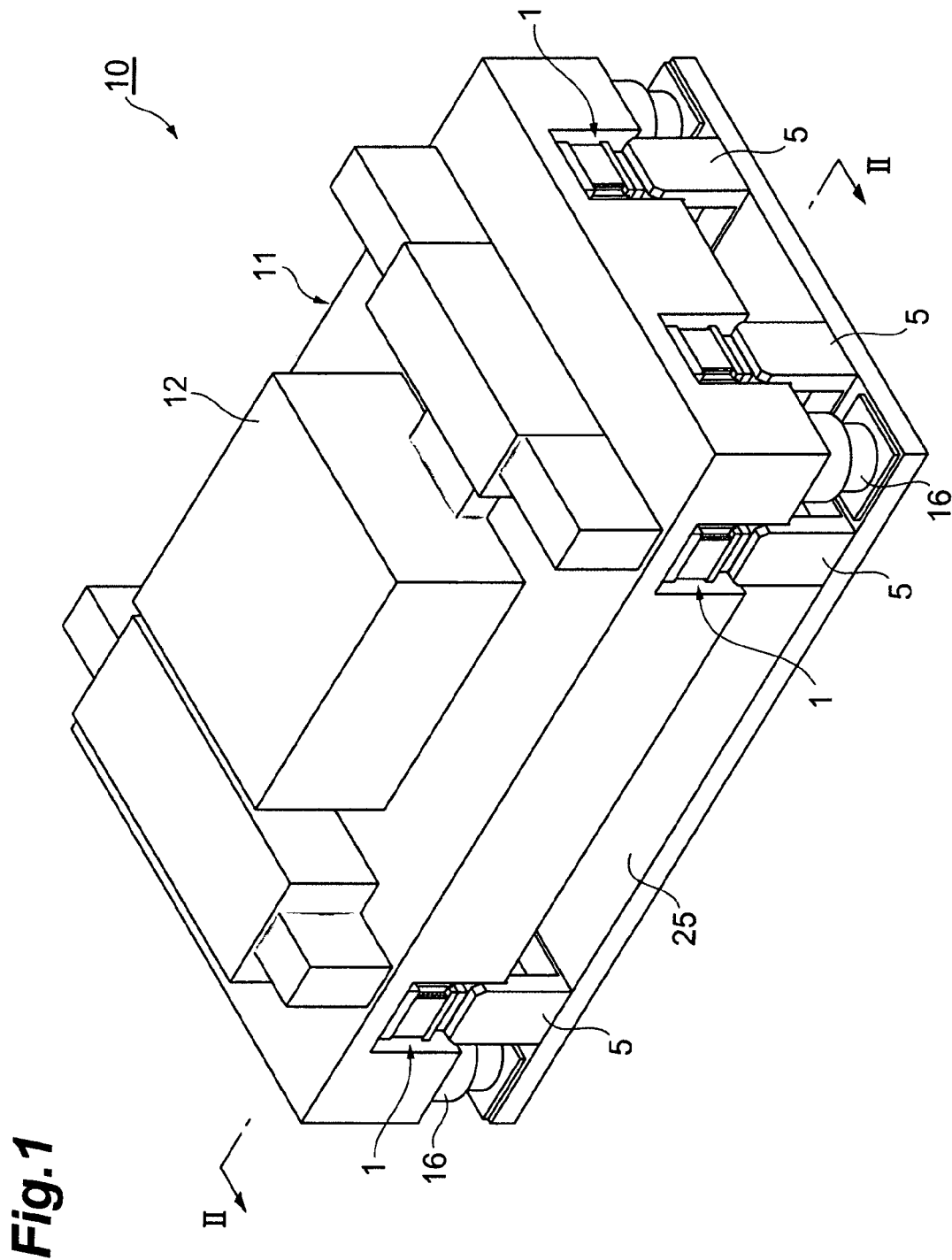
FIG. 1 is a perspective view illustrating a movable stage apparatus including a reaction force cancel system according to one embodiment of the present invention.

Hereinafter, with reference to the accompanying drawings, preferred embodiments of the invention will be described in detail. It is noted that in the description of drawings, the same reference numerals will be assigned to the same or equivalent elements, and the duplicate description will be omitted.

Figure 2:
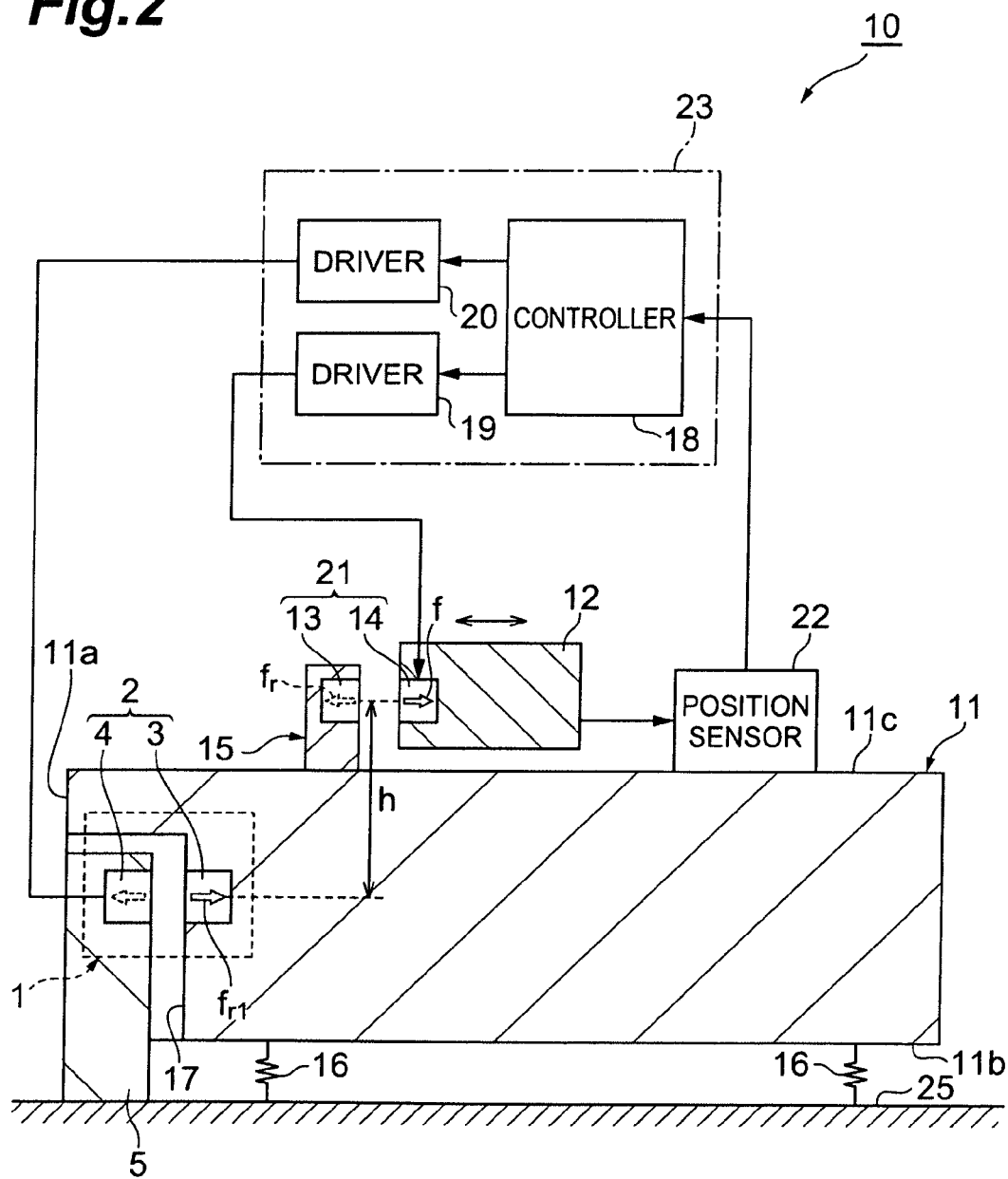
FIG. 2 is a schematic configuration view of a section taken along the lines II-II of FIG. 1.

FIG. 1 is a perspective view illustrating a movable stage apparatus including a reaction force cancel system according to one embodiment of the present invention, and FIG. 2 is a schematic configuration view of a section taken along the lines II-II of FIG. 1. As illustrated in FIG. 1 and FIG. 2, a movable stage apparatus 10 is employed as, for example, an exposure apparatus for semiconductors or liquid crystals, and an inspection equipment, and includes a surface plate 11, a stage 12, and a reaction force cancel system 1.

The surface plate 11 has a plate-shape and is formed of a stone, for example, in order to prevent deformation due to heat. The surface plate 11 is installed to be supported on a floor (base) 25 via vibration-isolating springs (vibration-isolating means) 16, 16, thereby being insulated against vibration (particularly, high-frequency vibration) from the floor 25. As illustrated in FIG. 2, in a side face 11a of the surface plate 11, a recessed section 17 is formed to open into the side face 11a and an underside face 11b, and the reaction force cancel system 1 is provided in the recessed section 17 (as will be described later in detail).

The stage 12 is designed to be movable in a horizontal direction on a top plate (plate surface) 11c of the surface plate 11 by a guide means (not shown) such as an air bearing, and attached to the surface plate 11. Then, the stage 12 is driven by a stage actuator 21 to move on the surface plate 11 in a horizontal direction.

The stage actuator 21 is configured to include a stator 13 provided in a stay 15 on the surface plate 11 and made of, for example, a permanent magnet, and a movable element 14 provided on the stage 12 and made of, for example, a magnetic coil. Further, the stator 13 and the movable element 14 are arranged contactlessly with each other. A control section 23 is connected to the stage actuator 21, and a drive current is supplied from the control section 23 to the movable element 14, and thereby a magnetic force is generated between the stator 13 and the movable element 14. A thrust (force) is applied by the generated magnetic force to the movable element 14, thus driving the stage 12.

Further, the movable stage apparatus 10 includes a position sensor 22 and the control section 23. The position sensor 22 detects a position in a horizontal direction of the stage 12, for example, a linear scale/laser interferometer, etc. are in use. The position sensor 22 is arranged on the surface plate 11. The position sensor 22 is connected to the control section 23, and outputs the detected position of the stage 12 to the control section 23 as position information.

The control section 23 is comprised of, for example, CPU, ROM, and RAM, and has a controller 18 and drivers 19, 20. The controller 18 outputs a command for driving the stage 12 (hereinafter referred to as "thrust-command") to the driver 19, based on the position information from the position sensor 22. Additionally, the controller 18 outputs a command for reducing a thrust (hereinafter referred to as "counter-thrust command") corresponding to the thrust-command to the driver 20. The driver 19 applies a drive current to the stage actuator 21 in response to the thrust command that has been input from the controller 18. Further, the driver 20 applies a drive current to the reaction force canceling actuator 2 of the reaction force cancel system 1 in response to the counter-thrust command that has been input from the controller 18.

Here, in the present embodiment, as described above, the reaction force cancel system 1 is provided in the recessed section 17 of the surface plate 11. Specifically, the recessed sections 17 are formed at two locations (eight locations in total formed) for each of four side faces of the surface plate 11, and the reaction force cancel system 1 is provided for each of these recessed sections 17. It is noted that, only the recessed section 17 formed in a side face 11a and the reaction force cancel system 1 provided in this recessed section 17 are illustrated in the figure, for convenience of illustration.

The reaction force cancel system 1 is a system for canceling a reaction force $f_r$ generated in the surface plate 11 upon movement of the stage 12, and includes a reaction force canceling actuator (application means) 2. The reaction force canceling actuator 2 applies a force $f_{r1}$ for reducing the reaction force $f_r$ (hereinafter referred to as "counter-thrust") to the surface plate 11. The reaction force canceling actuator 2 has a movable element 3 made of, for example, a permanent magnet, and a stator 4 made of, for example, a magnetic coil.

The movable element 3 is attached to the surface plate 11, and the stator 4 is attached to top end side of a pillar-like stationary frame 5 installed on the floor 25. The movable element 3 and the stator 4 are arranged so as to be contactless with each other. The stationary frame 5 is arranged within the recessed section 17 so that the surface plate 11 hangs over the stationary frame 5, and designed to be covered by the recessed section 17 of the surface plate 11. In other words, the movable elements 3 and the stator 4 are arranged at a lower position (floor 25 side) than a top surface (plate surface) 11c of the surface plate 11 so that the surface plate 11 hangs over the movable elements 3 and the stator 4.

These movable element 3 and the stator 4 are firmly secured with, for example, screws (not shown) to the surface plate 11 and the stationary frame 5, respectively. In the stationary frame 5 and the surface plate 11, a plurality of screw holes is formed at different positions in a height direction. Thus, the movable element 3 and the stator 4 can be adjusted in their height positions by changing the positions of screw holes for securing. That is, the reaction force canceling actuator 2 is designed to be adjustable in height.

In addition, the driver 20 of the control section 23 is connected to the reaction force canceling actuator 2. In the reaction force canceling actuator 2, a drive current is supplied from the driver 20 of the control section 23 to the stator 4, thereby a magnetic force is generated between the movable element 3 and the stator 4, and a counter-thrust $f_{r1}$ is generated in the movable element 3 by this magnetic force.

Further, the reaction force canceling actuator 2 is provided at such a height position that a difference h between the height of action point of a reaction force $f_r$ acting on the surface plate 11, and the height of action point of a counter-thrust $f_{r1}$ acting on the surface plate 11 becomes equal to or less than a tolerance $h_{max}$. Then, the tolerance $h_{max}$, will now be described as below.

First, when the movable stage apparatus 10 is dynamics modeled letting mass of the movable stage apparatus 10 to be M, moment of inertia to be J, horizontal spring constant of a vibration-isolating spring 16 to be kh, vertical spring constant to be kv, height from the supporting point of the vibration-isolating spring to the center of gravity of the movable stage apparatus 10 to be l, length in a horizontal direction from the supporting point to the center of gravity to be m, the equation of motion in this system can be expressed in the following equation (1) as:

[Formula 1]

$$M\ddot{x} = -2k_H(x - l\sin\theta)$$

$$M\ddot{z} = -2k_V(z - l + l\cos\theta)$$

$$J\ddot{\theta} = -hf_R + 2lk_H(x - l\sin\theta) - 2m^2 k_V \sin\theta \quad (1)$$

If we let $\sin\theta \approx \theta$, $\cos\theta \approx 1$, assuming that $\theta$ is sufficiently small, a motion in height direction can be neglected, and thus the above-mentioned equation (1) can be linearized in the following equation (2) as:

[Formula 2]

$$M\ddot{x} + 2k_H x - 2k_H l\theta = 0$$

$$J\ddot{\theta} + 2lk_H - (2l^2 k_H - 2m^2 k_V)\theta = -hf_R \quad (2)$$

When we define variables, and express the above equation (2) in a simple form, then the following equation (3) is obtained:

[Formula 3]

$$\ddot{x} + \omega_1^2 x - \omega_1^2 l\theta = 0 \quad (3)$$

$$\ddot{\theta} + \omega_2^2 \theta - \omega_1^2 \frac{l}{r^2} x = -h\frac{f_R}{J}$$

$$r \equiv \sqrt{\frac{J}{M}},\ \omega_1 \equiv \sqrt{\frac{2k_H}{M}},\ \omega_2 \equiv \sqrt{\frac{2k_H l^2 + 2k_V m^2}{Mr^2}},$$

$$\omega_3 \equiv \sqrt{\frac{2k_V}{M}}$$

Therefore, natural frequency of the system is given by the following equation (4) as:

[Formula 4]

$$\omega_{N1}^2, \omega_{N2}^2 = \frac{1}{2}\left\{(\omega_1^2 + \omega_2^2) \mp \sqrt{(\omega_1^2 + \omega_2^2)^2 - 4\omega_1^2 \omega_3^2 \frac{m^2}{r^2}}\right\} \quad (4)$$

Here, in the case where a reaction force $f_r$ and a counter-thrust $f_{r1}$ are acting while the stage 12 is being accelerated, initial displacement of the stage 12 is given by the following equation (5) as:

[Formula 5]

$$x_0 = l\theta_0 \quad (5)$$

$$\theta_0 = -\frac{hf_R}{2k_V m^2}$$

A free vibration of the stage 12 resulting from initial displacement of the above-mentioned equation (5) during uniform motion is given by the following equation (6), where, $r_{N1}$ and $r_{N2}$ are radiuses of gyration in respective vibration modes.

[Formula 6]

$$x = -\frac{\omega_{N2}^2}{\omega_{N2}^2 - \omega_{N1}^2} x_0 \cos\omega_{N1} t + \frac{\omega_{N1}^2}{\omega_{N2}^2 - \omega_{N1}^2} x_0 \cos\omega_{N2} t \quad (6)$$

$$\theta = -\frac{l}{r_{N1}} \frac{\omega_{N2}^2}{\omega_{N2}^2 - \omega_{N1}^2} \theta_0 \cos\omega_{N1} t + \frac{l}{r_{N2}} \frac{\omega_{N1}^2}{\omega_{N2}^2 - \omega_{N1}^2} \theta_0 \cos\omega_{N2} t$$

$$\therefore r_{N1} \equiv \frac{\omega_1^2 l}{\omega_1^2 - \omega_{N1}^2},\ r_{N2} \equiv \frac{\omega_1^2 l}{\omega_1^2 - \omega_{N2}^2}$$

Then, when the above equation (6) is separated into two frequency components, the following equation (7) is obtained:

[Formula 7]

$$x = x_{N1} + x_{N2},\ \theta = \theta_{N1} + \theta_{N2} \quad (7)$$

$$x_{N1} = -\frac{\omega_{N2}^2}{\omega_{N2}^2 - \omega_{N1}^2} x_0 \cos\omega_{N1} t$$

$$x_{N2} = \frac{\omega_{N1}^2}{\omega_{N2}^2 - \omega_{N1}^2} x_0 \cos\omega_{N2} t$$

$$\theta_{N1} = -\frac{l}{r_{N1}} \frac{\omega_{N2}^2}{\omega_{N2}^2 - \omega_{N1}^2} \theta_0 \cos\omega_{N1} t$$

$$\theta_{N2} = \frac{l}{r_{N2}} \frac{\omega_{N1}^2}{\omega_{N2}^2 - \omega_{N1}^2} \theta_0 \cos\omega_{N2} t$$

Figure 3:
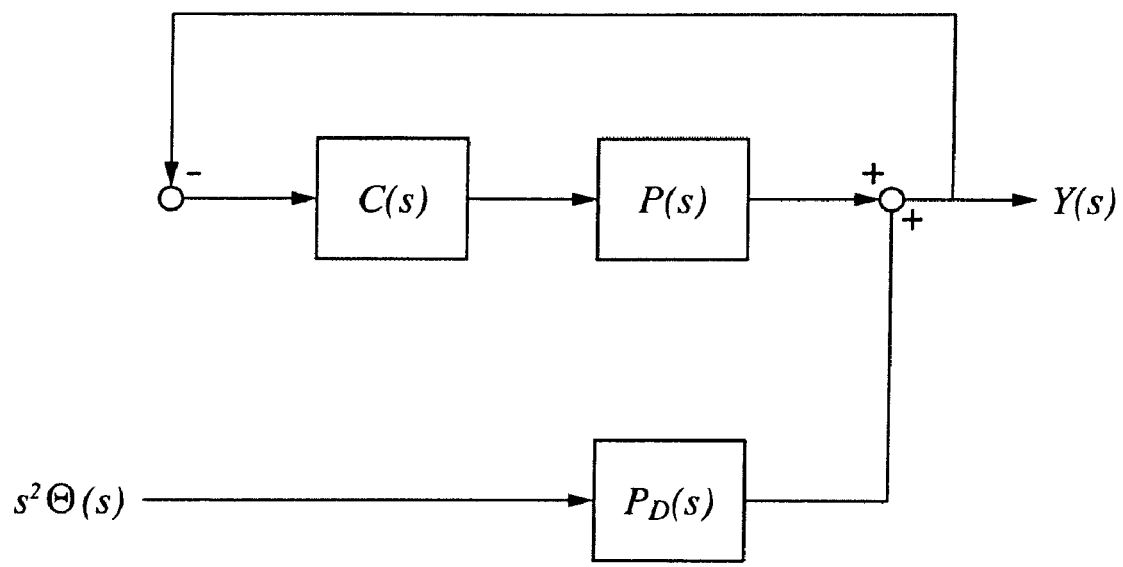
FIG. 3 is a control block diagram in a dynamics model of the movable stage apparatus illustrated in FIG. 1.

Next, by reason that the motion of the stage 12 is expressed as the superposition of two rotational motions with radiuses of gyration $r_{N1}$ and $r_{N2}$ by the use of the above-mentioned equation (7), the movable stage apparatus 10 is dynamics modeled as a surface plate 11 having only one rotational degree of freedom. The control block diagram of this system, is comprised of, as illustrated in FIG. 3, a transfer function C(s) of the controller 18, a transfer function P(s) of the stage 12, and a transfer function PD(s) of the surface plate 11 with respect to the position of the stage 12 of rotational angular speed disturbance.

These P(s) and PD(s) are expressed in the following equation (8). Here, to simplify the illustration, the rigidity and viscosity of the guide means such as air bearing are neglected. It is noted that $M_{SLIDER}$ denotes mass of the stage 12, $r_N$ denotes radius of gyration of each vibration mode, and N denotes the distance from the center of gravity of the movable stage apparatus 10 to the measuring point by the position sensor 22.

[Formula 8]

$$P(s) = \frac{1}{s^2 M_{SLIDER}} \quad (8)$$

$$P_D(s) = -\frac{r+N}{s^2}$$

Therefore, a transfer function from the acceleration disturbance to stage position is given by the following equation (9) as:

[Formula 9]

$$\frac{Y(s)}{s^2 \Theta(s)} = \frac{-(r_N + N)}{s^2 + \frac{C(s)}{M_{SLIDER}}} \quad (9)$$

A frequency characteristic of this system can be obtained by substituting s=jω, which gives the following equation (10) as:

[Formula 10]

$$\frac{Y(j\omega)}{-\omega^2 \Theta(j\omega)} = \frac{-(r_N + N)}{\frac{C(j\omega)}{M_{SLIDER}} - \omega^2} \quad (10)$$

If we let C(jω)=Kp (constant), in consideration of only amplitude of the positional deviation according to respective vibration modes, amplitude is given by the following equation (11). It is noted that, the $K_p$ represents a control gain to bring the stage 12 close to a target position, and it is a feedback gain to drive the stage actuator 21 based on the position of the stage 12 detected by the position sensor 22.

[Formula 11]

$$Y_{N1} = \frac{-(r_{N1}+N)}{\frac{K_P}{M_{SLIDER}} - \omega_{N1}^2} \left( \frac{1}{r_{N1}} \frac{\omega_{N1}^2 \omega_{N2}^2}{\omega_{N2}^2 - \omega_{N1}^2} \theta_0 \right) \quad (11)$$

$$Y_{N2} = \frac{(r_{N2}+N)}{\frac{K_P}{M_{SLIDER}} - \omega_{N2}^2} \left( \frac{1}{r_{N2}} \frac{\omega_{N1}^2 \omega_{N2}^2}{\omega_{N2}^2 - \omega_{N1}^2} \theta_0 \right)$$

Here, generally from $K_p/M_{SLIDE} \gg \omega^2_{N1}$, $\omega^2_{N2}$, the above-mentioned equation (11) is approximated, which gives the following equation (12) as:

[Formula 12]

$$|Y| = |Y_{N1} + Y_{N2}| = \frac{hNM_{SLIDER}f_R}{JK_P} \quad (12)$$

From the above, in the case where a tolerance $Y_{max}$ (for example, several hundreds nm) of positional deviation of the stage 12 is determined as the specification, as shown in the following equation (13), a tolerance $h_{max}$ will be set based on this positional deviation $Y_{max}$. Note that positional deviation of the stage 12 means the amount of deviation of the stage position.

[Formula 13]

$$h_{max} = \frac{Y_{max} J K_P}{N M_{SLIDER} f_R} \quad (13)$$

where,
$Y_{max}$: tolerance of positional deviation of stage
J: moment of inertia of movable stage apparatus
$K_p$: control gain
N: distance from the height of the center of gravity of movable stage apparatus to the height of the measuring point of position of stage
$M_{SLIDER}$: mass of stage
$f_r$: reaction force.

In the movable stage apparatus 10 configured in such a manner, the position of the stage 12 is detected by the position sensor 22, a thrust-command is determined by the controller 18 based on the detected position, and a drive current in response to the determined thrust-command is applied to the stage actuator 21 by the driver 19. Then, a thrust f depending on the applied drive current is generated by the stage actuator 21, and the stage 12 is driven by this thrust f.

At this moment, the thrust f is acted on the stage 12, and thereby a reaction force $f_r$, a force in opposite direction to the thrust f resulting from its reaction and with the same magnitude is acted onto the surface plate 11. In the movable stage apparatus 10, a counter-thrust command is output to the driver 20 by the controller 18, and a drive current in response to the counter-thrust command is applied to the reaction force canceling actuator 2 by the driver 20. Then, a counter-thrust $f_{r1}$ depending on the applied drive current is generated by the reaction force canceling actuator 2, and the counter-thrust $f_{r1}$ is acted on the surface plate 11, and as a result, the reaction force $f_{r1}$ is reduced or furthermore counterbalanced.

Up to this point, in the present embodiment, the counter-thrust $f_{r1}$ is applied to the surface plate 11 by the reaction force canceling actuator 2. Thus, the counter-thrust $f_{r1}$ and the reaction force $f_r$ are canceled out each other, resulting in that a force acting on the surface plate 11 is reliably reduced or eliminated. In addition, as described above, the reaction force canceling actuator 2 is arranged at a lower position than the top surface 11c of the surface plate 11 so that the surface plate 11 hangs over the reaction force canceling actuator 2, and a difference h between the height of the action point of the reaction force $f_r$ and the height of the action point of the counter-thrust $f_{r1}$ is equal to or less than $h_{max}$. As a result, a moment acting on the surface plate 11 will become equal to or less than a constant value.

Therefore, according to the present embodiment, stabilization of the stage 12 can be improved. This is because, unless the height of action point of the reaction force $f_r$ and the height of action point of the counter-thrust $f_{r1}$ coincide with each other, the moment acting on the surface plate 11 can not be completely eliminated, although if a force (translational force) acting on the surface plate 11 can be completely eliminated, stabilization of the stage 12 can be improved even if the moment acting on surface plate 11 fails to be completely eliminated. In other words, this is because, if the reaction force $f_r$ acting on the surface plate 11 is eliminated, as well as the moment acting on the surface plate 11 is sufficiently reduced, stabilization of the stage 12 can be sufficiently improved.

Further, in this way, by reason that the reaction force canceling actuator 2 is arranged at a lower position than the top surface 11c of the surface plate 11 so that the surface plate 11 hangs over the reaction force canceling actuator 2, the space for the top surface 11c is sufficiently secured, and there is also no need to increase an installed area (so-called footprint) of the movable stage apparatus 10. In other words, the space for the movable stage apparatus 10 can be efficiently utilized, thus making it possible to suppress the increase in size of the movable stage apparatus 10.

Consequently, according to the present embodiment, stabilization of the stage 12 in the movable stage apparatus 10 can be improved, and the increase in size of the movable stage apparatus 10 can be suppressed. As a result, in the present embodiment, it has become possible to strike a balance between effective utilization of space for the movable stage apparatus 10, and securing the function of the reaction force cancel system 1.

Further, by reason that there is no need for the heights of action points of the reaction force $f_r$ and the counter-thrust $f_{r1}$ to coincide with each other, the following effects will be produced. That is to say, it is possible to arrange, for example, optical mount or the like on the surface plate 11. Moreover, even in the case where it is impossible to cause the heights of action points of the reaction force $f_r$ and the counter-thrust $f_{r1}$ to coincide with each other due to insufficient space, when mounting the reaction force cancel system 1 in existing movable stage apparatus, it becomes possible to reliably apply the reaction force cancel system 1.

Further, in the present embodiment, as described above, a difference h between the height of action point of the reaction force $f_r$ acting on the surface plate 11 and the height of action point of the counter-thrust $f_{r1}$ acting on the surface plate 11, is designed to be equal to or less than a tolerance $h_{max}$ as expressed in the above-mentioned equation (13). Thereby, in the case where a tolerance $Y_{max}$ of position deviation is predetermined as a specification, a tolerance $h_{max}$ can be set based on this specification, and by reason that this difference h is made to be equal to or less than the tolerance $h_{max}$, the above-mentioned effects, that is, the effects of improving the stabilization of the stage 12 in the movable stage apparatus 10, as well as suppressing an increase in size of the movable stage apparatus 10 can be reliably achieved.

Further, as described above, by reason that the reaction force canceling actuator 2 is designed to be adjustable in height, even if accuracy (positional deviation) of the stage 12 required for the movable stage apparatus 10 is changed, it becomes possible to cope with such accuracy by changing (adjusting) the height of the reaction force canceling actuator 2. In addition, in this case, a desired stabilization of the stage can be obtained, and it is possible to set the height at which the reaction force canceling actuator 2 is to be arranged, while checking positional deviation of the stage 12.

Furthermore, as described above, by reason that the reaction force canceling actuator 2 is firmly secured adjustable in height with a screw, such securing becomes more rigid compared with a slide type height adjustment, and furthermore, positional deviation of the reaction force canceling actuator 2 can be suppressed.

Additionally, as described above, because the movable element 3 and the stator 4 of the reaction force canceling actuator 2 are designed to be contactless with each other, vibration from the floor 25 is prevented from propagating to the surface plate 11 via the reaction force canceling actuator 2. Further, as described above, by reason that a permanent magnet serving as the movable element 3 is attached to the surface plate 11, and a magnetic coil serving as the stator 4 is attached to the stationary frame 5, the influence of heat generation caused by applying a drive current to the stator 4 is prevented from extending into the surface plate 11.

Up to this point, preferred embodiments of the present invention have been described. However, the present invention is not limited to the above-mentioned embodiments.

For example, in the above-mentioned embodiments, the surface plate 11 is installed on the floor 25 via the vibration-isolating springs 16, 16. However, it may be installed via other mechanical springs, alternatively air springs or the like may be used, and it is only required that a device (vibration-isolating means) for isolating the surface plate 11 against vibration from the floor 25 is used.

Further, in the above-mentioned embodiments, the stator 13 of the stage actuator 21 is made of a permanent magnet, and a movable element 14 is made of a magnetic coil. However, the stator may be made of a magnetic coil, and the movable element may be made of a permanent magnet. It is noted that, in this case, a drive current is supplied to the stator serving as the magnetic coil. In addition, in the above-mentioned embodiments, the movable element 3 of the reaction force canceling actuator 2 is made of a permanent magnet, and the stator 4 is made of a magnetic coil. However, the movable element may be made of a magnetic coil, and the stator may be made of a permanent magnet. In this case, the drive current is supplied to the movable element serving as the magnetic coil.

According to the present invention, it becomes possible to improve stabilization of the stage in the movable stage apparatus, and to suppress an increase in size of the movable stage apparatus.

What is claimed is:

1. A reaction force cancel system provided in a movable stage apparatus in which a stage moves on a plate surface of a surface plate installed on a base via a vibration-isolating section to cancel a reaction force generated in the surface plate upon movement of the stage, the system comprising,
an application device configured to apply a force in a horizontal direction to reduce the reaction force to the surface plate, wherein
the application device is arranged toward the base side rather than the plate surface of the surface plate such that the surface plate hangs over the application device.

2. The reaction force cancel system according to claim 1, wherein a difference h between a height of action point of the reaction force acting on the surface plate and a height of action point of the force for reducing the reaction force acting on the surface plate is designed to be equal to or less than a tolerance $h_{max}$ as expressed in the following equation:

$$h_{max} = (Y_{max} \cdot J \cdot J_p)/(N \cdot M_{SLIDER} \cdot f_r)$$

where,
$Y_{max}$: tolerance of positional deviation of stage
J: moment of inertia of movable stage apparatus
$K_p$: control gain N: distance from the height of center of gravity of movable stage apparatus to the height of measuring point of position of stage $M_{SLIDER}$: mass of stage $f_r$: reaction force.

3. The reaction force cancel system according to claim 1, wherein the application device is designed to be adjustable in height.

4. The reaction force cancel system according to claim 1, wherein the application device has a movable element attached to the surface plate, and a stator attached to the base contactlessly with the movable element, and configured such that the force for reducing the reaction force is applied from the stator to the movable element.

5. A reaction force cancel system, provided in a movable stage apparatus where a stage moves on a surface plate supported by a vibration-isolating section to cancel a reaction force generated on the surface plate upon movement of the stage, the system comprising, an actuator configured to apply a force to the surface plate, wherein the actuator is provided in a recessed section of a side face of the surface plate.

6. The reaction force cancel system according to claim 5, wherein the actuator has a movable element and a stator, and the movable element is fixedly secured in an interior of the recessed section.

7. The reaction force cancel system according to claim 5, wherein the stator is arranged contactlessly with the movable element in an interior of the recessed section.

8. The reaction force cancel system according to claim 5, wherein the stator does not protrude beyond the side face of the surface plate.

\* \* \* \* \*